(12) United States Patent
Park

(10) Patent No.: US 7,493,713 B2
(45) Date of Patent: Feb. 24, 2009

(54) IMAGE SENSOR AND RELATED METHOD OF FABRICATION

(75) Inventor: Young-Hoon Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 57 days.

(21) Appl. No.: 11/334,570

(22) Filed: Jan. 19, 2006

(65) Prior Publication Data

US 2006/0172451 A1    Aug. 3, 2006

(30) Foreign Application Priority Data

Jan. 28, 2005    (KR) .............. 10-2005-0008150

(51) Int. Cl.
*H01L 21/00* (2006.01)
*H01L 31/062* (2006.01)
*H01L 31/113* (2006.01)
*H01L 27/00* (2006.01)
*H01J 5/16* (2006.01)
*H01J 40/14* (2006.01)
*G01J 3/50* (2006.01)

(52) U.S. Cl. ............... 38/70; 438/7; 438/27; 438/28; 438/29; 438/48; 438/69; 257/290; 257/291; 257/292; 257/294; 257/258; 257/440; 257/464; 257/E27.133; 257/E27.134; 250/208.1; 250/226

(58) Field of Classification Search .............. 438/7, 438/27–29, 48, 69, 70; 257/290–292, 294, 257/258, 440, 464, E27.133, E27.134; 250/208.1, 250/226

See application file for complete search history.

(56) References Cited

U.S. PATENT DOCUMENTS

| | | | | |
|---|---|---|---|---|
| 5,583,351 A | * | 12/1996 | Brown et al. | 257/89 |
| 5,914,749 A | * | 6/1999 | Bawolek et al. | 348/273 |
| 6,359,323 B1 | * | 3/2002 | Eom et al. | 257/440 |
| 6,503,831 B2 | * | 1/2003 | Speakman | 438/674 |
| 6,566,723 B1 | * | 5/2003 | Vook et al. | 257/440 |
| 6,756,618 B2 | * | 6/2004 | Hong | 257/292 |
| 6,765,230 B2 | * | 7/2004 | Murade | 257/59 |
| 6,770,909 B2 | * | 8/2004 | Murade | 257/59 |
| 6,818,934 B1 | * | 11/2004 | Yamamoto | 257/294 |
| 6,830,951 B2 | * | 12/2004 | Laurin et al. | 438/69 |
| 6,841,816 B2 | * | 1/2005 | Merrill et al. | 257/294 |
| 6,861,280 B2 | * | 3/2005 | Yamamoto | 438/70 |
| 6,872,975 B2 | * | 3/2005 | Murade | 257/59 |
| 6,894,265 B2 | * | 5/2005 | Merrill et al. | 250/208.1 |
| 6,911,684 B2 | * | 6/2005 | Yamamoto | 257/294 |
| 6,914,314 B2 | * | 7/2005 | Merrill et al. | 257/440 |

(Continued)

FOREIGN PATENT DOCUMENTS

EP    223136 A2 *    5/1987

(Continued)

*Primary Examiner*—David Vu
*Assistant Examiner*—Arman Khosraviani
(74) *Attorney, Agent, or Firm*—Volentine & Whitt, PLLC

(57) ABSTRACT

An image sensor and related method of fabrication are disclosed. The image sensor comprises a plurality of photoelectric conversion regions disposed in a predetermined field of a semiconductor substrate, color filters arranged on the photoelectric conversion regions, and a reflection protection structure disposed between the photoelectric conversion regions and the color filters. The reflection protection structure comprises portions having different thicknesses in relation to the color filters.

13 Claims, 4 Drawing Sheets

U.S. PATENT DOCUMENTS

| | | | |
|---|---|---|---|
| 6,933,167 B2 * | 8/2005 | Yamamoto | 438/69 |
| 6,960,799 B2 * | 11/2005 | Descure | 257/292 |
| 6,974,715 B2 * | 12/2005 | Lee | 438/48 |
| 7,012,240 B2 * | 3/2006 | Yaung | 250/214.1 |
| 7,053,427 B2 * | 5/2006 | Tanigawa et al. | 257/294 |
| 7,053,952 B2 * | 5/2006 | Tsuboi | 348/340 |
| 7,084,472 B2 * | 8/2006 | Fukuyoshi et al. | 257/432 |
| 7,091,463 B2 * | 8/2006 | Suzuki et al. | 250/208.1 |
| 7,157,352 B2 * | 1/2007 | Yamanaka | 438/458 |
| 7,166,880 B2 * | 1/2007 | Merrill et al. | 257/294 |
| 7,180,044 B2 * | 2/2007 | Yu | 250/208.1 |
| 7,193,289 B2 * | 3/2007 | Adkisson et al. | 257/431 |
| 7,217,590 B2 * | 5/2007 | Pourquier et al. | 438/70 |
| 7,223,960 B2 * | 5/2007 | Mouli | 250/226 |
| 2002/0048840 A1 * | 4/2002 | Tanigawa | 438/65 |
| 2003/0132367 A1 * | 7/2003 | Suzuki et al. | 250/208.1 |
| 2004/0147068 A1 | 7/2004 | Toyoda et al. | |
| 2004/0178463 A1 * | 9/2004 | Merrill et al. | 257/440 |
| 2004/0178464 A1 * | 9/2004 | Merrill et al. | 257/440 |
| 2004/0178465 A1 * | 9/2004 | Merrill et al. | 257/440 |
| 2004/0178466 A1 * | 9/2004 | Merrill et al. | 257/440 |
| 2004/0185596 A1 * | 9/2004 | Tanigawa | 438/69 |
| 2004/0251477 A1 * | 12/2004 | Pourquier et al. | 257/225 |
| 2005/0017278 A1 * | 1/2005 | Yamamoto | 257/294 |
| 2005/0040317 A1 * | 2/2005 | Yaung | 250/208.1 |
| 2005/0045927 A1 * | 3/2005 | Li | 257/294 |
| 2005/0048690 A1 * | 3/2005 | Yamamoto | 438/69 |
| 2005/0074954 A1 * | 4/2005 | Yamanaka | 438/458 |
| 2005/0087829 A1 * | 4/2005 | Merrill et al. | 257/440 |
| 2005/0098842 A1 * | 5/2005 | Yamamoto | 257/428 |
| 2005/0274871 A1 * | 12/2005 | Li et al. | 250/208.1 |
| 2006/0138480 A1 * | 6/2006 | Adkisson et al. | 257/291 |

FOREIGN PATENT DOCUMENTS

| | | |
|---|---|---|
| JP | 10-051023 | 2/1998 |
| JP | 2002-083949 | 3/2002 |
| KR | 1020030001075 A | 1/2003 |
| KR | 1020030057676 A | 7/2003 |
| KR | 1020040058692 | 7/2004 |
| KR | 1020040067797 | 7/2004 |
| KR | 1020060010900 | 2/2006 |

* cited by examiner

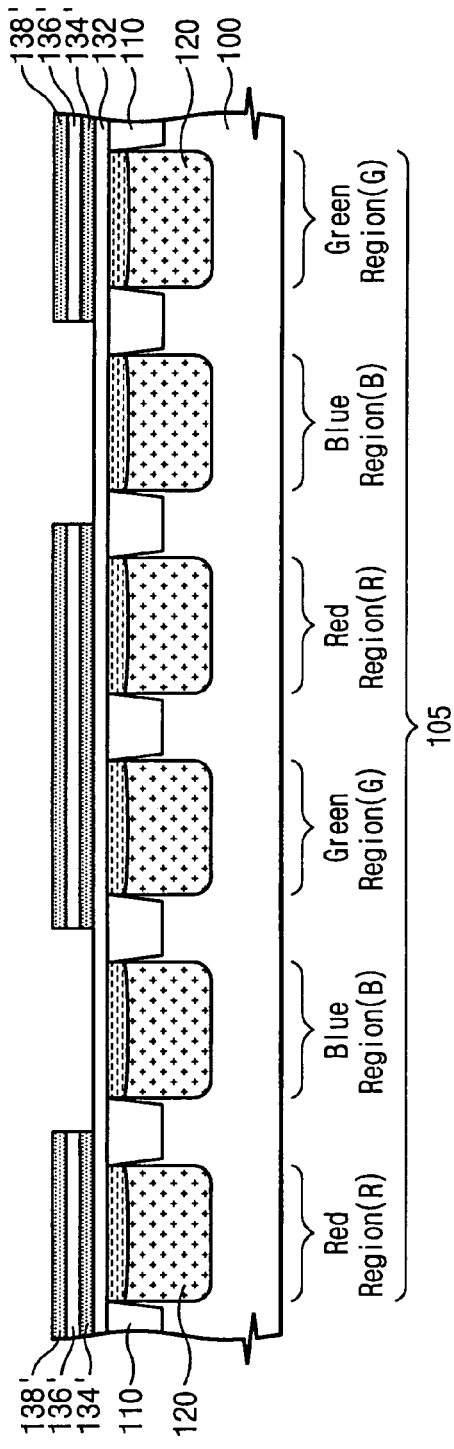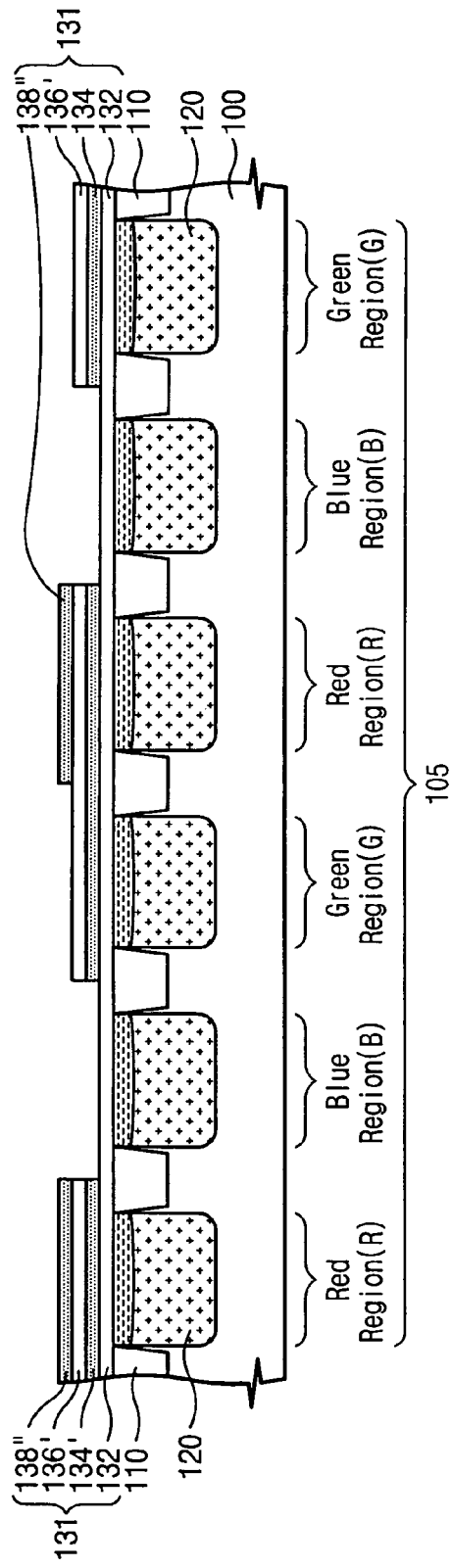

IMAGE SENSOR AND RELATED METHOD OF FABRICATION

BACKGROUND OF THE INVENTION

1. Field of the Invention

Embodiments of the invention relate to image sensors. More particularly, embodiments of the invention relate to image sensors having improved photoelectric conversion efficiency and related methods of fabrication.

This application claims priority to Korean Patent Application 2005-08150 filed on Jan. 28, 2005, the subject matter of which is hereby incorporated by reference in its entirety.

2. Discussion of Related Art

Image sensors are electronic devices adapted to transform optical signals defining a visual image into electric signals. Image sensors are widely used in contemporary mobile devices, such as cell phones, digital video and still cameras, personal digital assistants (PDAs), toys, game systems, robots, Personal Computers (PCs), PC cameras, optical mouse devices, scanners, security cameras, infrared cameras, cameras for organism identification and wireless inspection, etc.

In general, the conventional image sensor comprises a light receiver portion adapted to generate electrical charge in response to incident light of defined wavelength, and an electronics portion adapted to process the generated electrical charge received from the light receiver portion. The performance quality of any given image sensor may be evaluated according to such characteristics as sensitivity, responsivity, dynamic range, uniformity, shuttering, speed, and noise.

In order to improve the performance characteristics of an image sensor, it is necessary to address the issue photoelectric conversion efficiency, or the efficiency with which the image sensor converts incident light signals to corresponding electrical signals. Since the overall photoelectric conversion efficiency of an image sensor is the product of several variables, including quantum efficiency, condensing rates of related microscopic lenses, etc., many different approaches have been taken to the improvement of photoelectric conversion efficiency. In this regard, the quantum efficiency component contributing to the overall efficiency of photoelectric conversion may deteriorate due to such effects as the: (1) reflection differences caused by various refractive indexes for films disposed along a path for the incident light; (2) diffraction at the openings of photodiodes; and (3) transmission of photodiodes.

It should further be noted that photoelectric conversion efficiency is often a product (i.e., varies with) the incident light wavelength. For example, the penetration depth of incident light into the surface of active elements forming the conventional image sensor increases with wavelength. Thus, incident light in the red range (e.g., incident light having a wavelength of about 700 nm) may penetrate up to three times (3×) deeper into a conventional photodiode structure than incident light in the blue range having a much shorter wavelength.

The resulting variance as a function of incident light wavelength presents a real challenge to the problem of providing an image sensor having a desired, flat photoelectric conversion efficiency. Many conventional image sensors have problems with low composition of red color and asymmetrical color ratios. Moreover, the electron-hole pairs generated by the red color incident light penetrating to a relatively greater depth within the photodiode, may flow into the photodiode regions of adjacent pixels, thereby inducing the problem of crosstalk (i.e., inter-pixel noise).

SUMMARY OF THE INVENTION

Embodiments of the invention provide an image sensor having improved photoelectric conversion efficiency for incident light having relatively longer wavelengths. By so doing, such embodiments tend to minmize crosstalk. Embodiments of the invention also provide a method of fabricating such image sensors.

Thus in one embodiment, the invention provides an image sensor comprising; a plurality of photoelectric conversion regions arranged in predetermined fields on a semiconductor substrate, a plurality of color filters, each color filter respectively arranged on a corresponding one of the plurality of photoelectric conversion regions, and a reflection protection structure disposed between the plurality of photoelectric conversion regions and the plurality of color filters, wherein the reflection protection structure comprises a plurality of portions, each portion having a different thickness associated with one of the plurality of color filters.

In another embodiment, the invention provides a method of fabricating an image sensor, comprising; forming a plurality of photoelectric conversion regions in predetermined fields of a semiconductor substrate, forming a reflection protection structure on the plurality of photoelectric conversion regions, and forming a plurality of color filters on the reflection protection structure, wherein the reflection protection structure comprises a plurality of portions, each portion having a different thickness associated with one of the plurality of color filters.

BRIEF DESCRIPTION OF THE DRAWINGS

Several embodiments of the invention will be described with reference to the accompanying drawings. The thickness of layers and regions in the drawings may have been exaggerated for clarity. Like numerals refer to like or similar elements in the drawings and throughout the corresponding written description. In the drawings:

FIGS 1-5 are sectional views illustrating a method of fabricating an exemplary image sensor in accordance with an embodiment of the invention.

DESCRIPTION OF EXEMPLARY EMBODIMENTS

Several embodiments of the invention will be described below in some additional detail with reference to the accompanying drawings. The present invention may, however, be embodied in different forms and should not be constructed as being limited to only the embodiments set forth herein. Rather, these embodiments are presented as a teaching example.

It will be understood that when a layer (or film) is referred to as being "on" another layer or substrate, it can be directly on the other layer or substrate, or intervening layers may also be present.

FIGS. 1 through 5 are sectional views illustrating a method of fabricating an image sensor in accordance with an embodiment of the invention.

Figure 1:
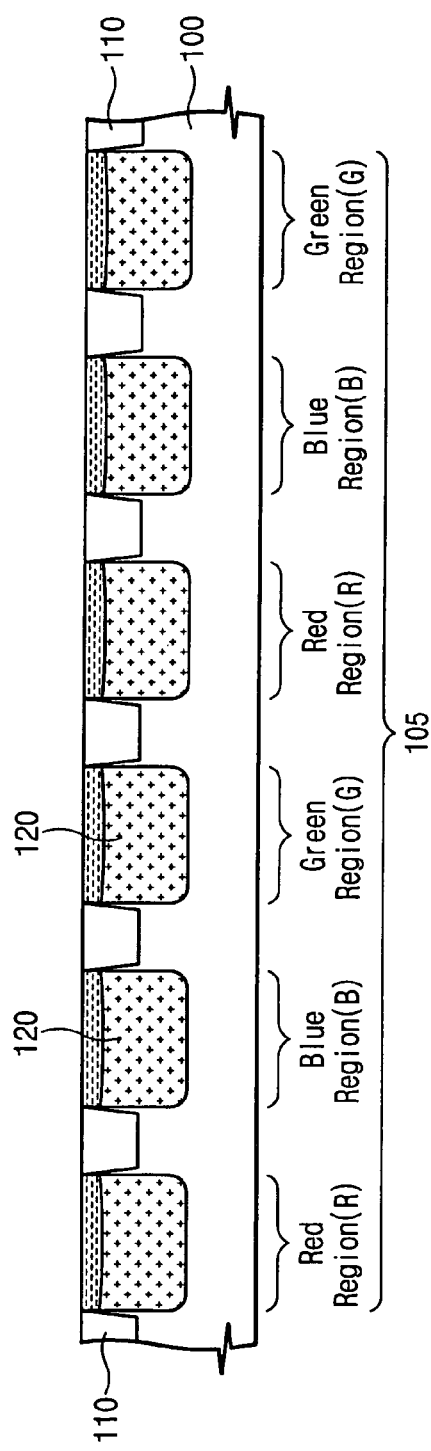

Referring now to FIG. 1, field isolation regions 110 are formed to confine a plurality of photoelectric conversion (e.g., pixel) regions 105 in predetermined fields of a semiconductor substrate 100. Respective photoelectric conversion regions 105 are regularly arranged on rows and columns and form a pixel array.

Figure 5:
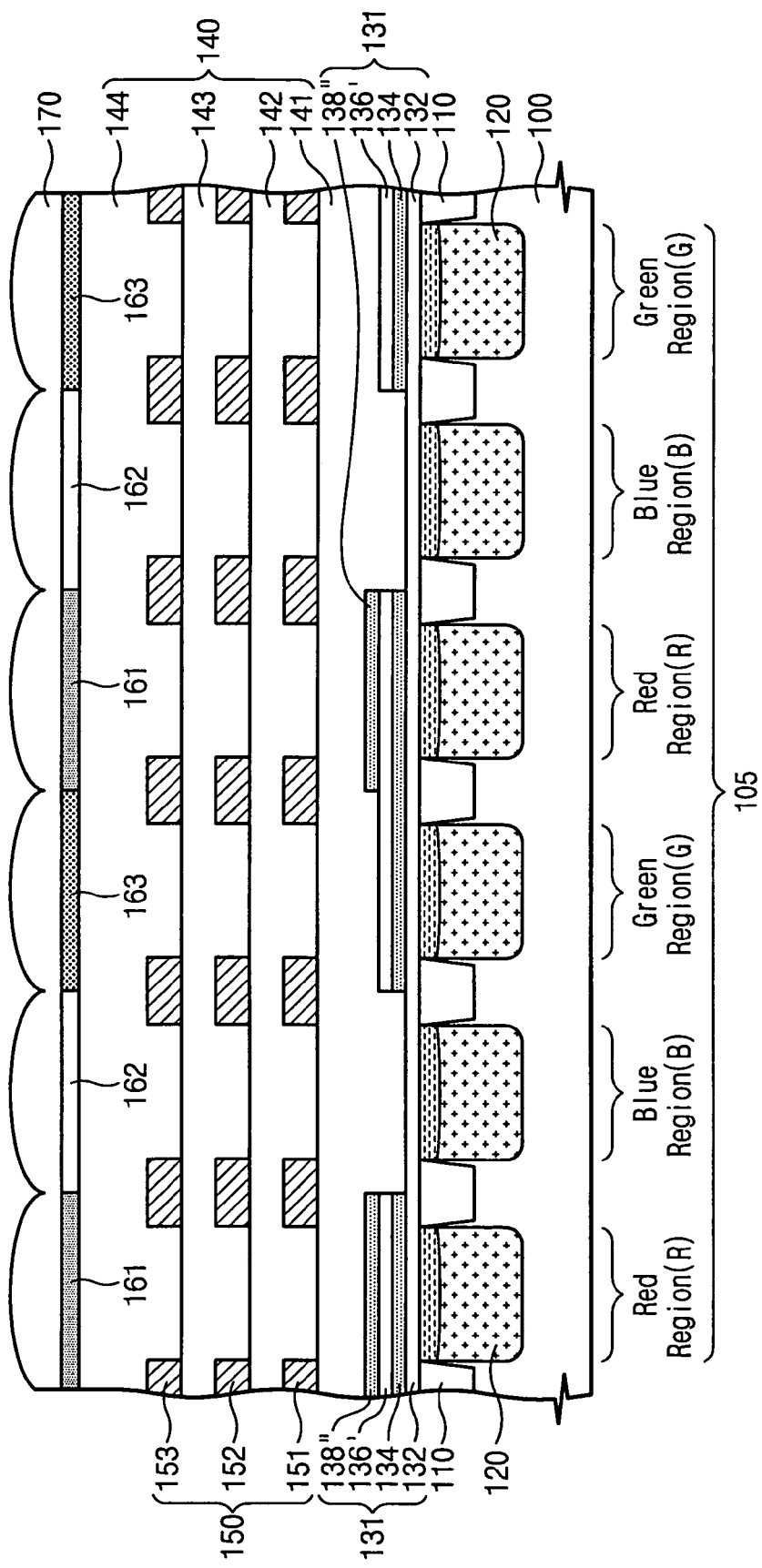

Respective pixel regions 105 within the pixel array are differentiated by association with different color filters (e.g., elements 161, 162, and 163 in FIG. 5). For example, where color filters are arranged in a pixel array adapted to transmit red (R), green (G), and blue (B), the pixel regions 105 are differentiated as red regions (R), green regions (G), and blue regions (B). In the description that follows an exemplary pixel array comprising these three kinds of color filters, (i.e., RGB filters) will be assumed as a working example. However, it should be understood that other kinds of filters are available and that the invention is not limited to the use of only RGB color filters. For instance, if the color filters are arranged in a pixel array adapted to transmit four color components, then cyan, magenta, yellow, and green color filters may be used.

Returning to FIG. 1, each pixel region 105 comprises a photoelectric conversion region 120 adapted to convert incident light into electrical charge. The photoelectric conversion region 120 may be formed from photodiodes having PN junction. In one embodiment, a fabrication method adapted to form the constituent photodiodes may comprise a step of implanting ionic impurities having different conductivities into respective pixel regions 105.

Figure 2:
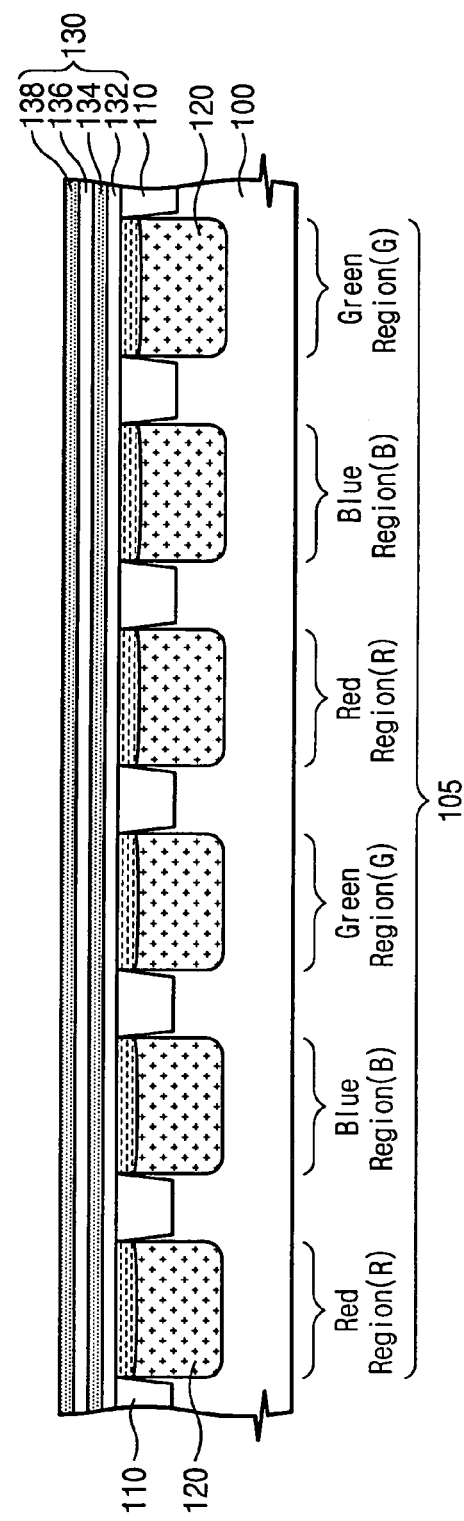

Referring to FIG. 2, a reflection protection film 130 is deposited on the resultant structure including the photoelectric conversion regions 120. Reflection protection film 130 may be formed from multiple films. Consistent with various embodiments of the invention, films of varying thickness and composition may be combined to form reflection protection film 130. Those of ordinary skill in the art will appreciate that combinational flexibility in the formation of reflection protection film 130 will allow maximum photoelectric conversion efficiency for image sensor fabricated in accordance with embodiments of the invention.

According to one illustrative embodiment of the invention, reflection protection film 130 may be formed from a first insulation film 132, a second insulation film 134, a third insulation film 136, and a fourth insulation film 138. It is preferable at least in one embodiment that fourth insulation film 138 has an etch selectivity relative to third insulation film 136, that third insulation film 136 has an etch selectivity relative to second insulation film 134, and that second insulation film 136 has an etch selectivity relative to first insulation film 132. According to one more specific embodiment, first and third insulation films, 132 and 136, are silicon oxide films deposited to a thickness of less than 100 Å, while second and fourth insulation films, 134 and 138, are silicon nitride films.

Referring to FIG. 3, a first mask (not shown) is formed on reflection protection film 130, exposing the blue regions B. In one embodiment, the first mask is a photoresist pattern formed using conventional photolithography processing techniques.

Thereafter, fourth, third, and second insulation films, 138, 136, and 134, are selectively etched in sequence through the first mask until the desired portions of the top surface of first insulation film 132 are exposed. As a result, second, third, and fourth insulation patterns, 134', 136', and 138' are formed within a stack on the first insulation film 132 over the red and green regions, R and G.

Referring to FIG. 4, after removing the first mask, a second mask (not shown) is formed on the resultant structure including the second through fourth insulation patterns, thereby exposing the green regions G. In one embodiment, the second mask is preferred formed from a photoresist pattern using conventional photolithography processing techniques.

After this, the fourth etched insulation film 138' is selectively etched through the second mask until desired portions of the top surface of the third insulation pattern 136' are exposed. As a result, over the red regions R, a fourth etched insulation pattern 138" is formed that partially covers the third insulation pattern 136'. According to this exemplary embodiment of the invention, the stacked combination of first insulation film 132, second and third insulation patterns, 134' and 136', and fourth etched insulation pattern 138", form respective reflection protection structure 131.

According to an embodiment of the invention, the reflection protection structure 131 comprises portions of varying thickness corresponding to the red, green, and blue regions, R, G, and B. In other words, the first insulation film 132 is formed on all of the red, green, and blue regions, R, G, and B. The second and third insulation patterns, 134' and 136', are formed on first insulation film 132 on the red and green regions R and G. In addition, the etched fourth insulation pattern 138" is formed on the third insulation pattern 136' on the red regions R. Thus, the exposed top surface of first insulation film 132 covers the blue regions B, the exposed top surface of third insulation pattern 136' covers the green regions G, and the exposed top surface of the etched fourth insulation layer 138" covers the red regions R.

Referring to FIG. 5, an interlevel insulation film 140 and metal interconnections 150 disposed within interlevel insulation film 140 are formed on reflection protection structure 131. Interlevel insulation film 140 and metal interconnections 150 may constitute a multilevel interconnection structure. In other words, interlevel insulation film 140 may be composed of a first interlevel insulation film 141, a second interlevel insulation film 142, a third interlevel insulation film 143, and a fourth interlevel insulation film 144 those are stacked on the resultant architecture including the reflection protection structure 131. And, metal interconnections 150 may be composed of first through third interconnections, 151, 152, and 153, each formed on the first through third insulation films 141, 142 and 143, respectively.

Following formation of interlevel insulation film 140 and metal interconnections 150, red filters 161, blue filters 162, and green filters 163 are settled on the top surface of interlevel insulation film 140 (e.g., fourth interlevel insulation film 144). Red filters 161 are located on the red regions R, blue filters 162 are located on the blue regions B, and green filters 163 are located on the green regions G. Thereafter, microscopic lenses 170 are formed on the color filters 161, 162, and 163.

Figure 6:
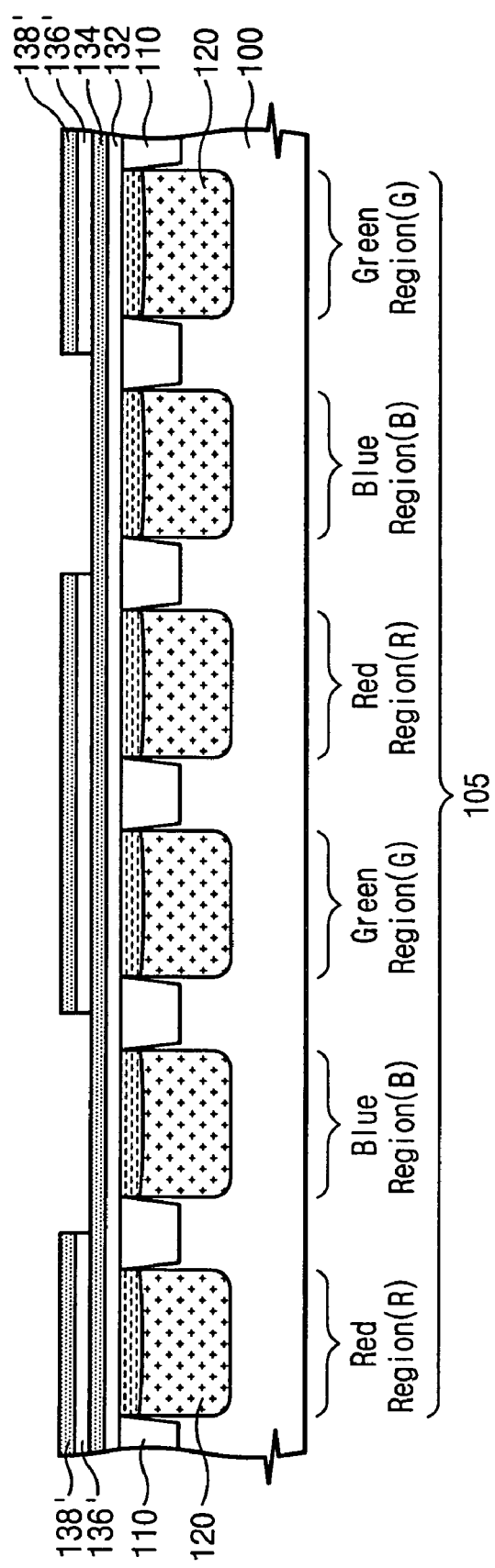
FIG. 6 is a sectional view illustrating an image sensor in accordance with another embodiment of the invention.

FIG. 6 is a sectional view illustrating an image sensor in accordance with another embodiment of the invention.

Referring to FIG. 6, the fourth and third insulation films, 138 and 139, are selectively etched using the first mask as an etch mask until partially exposing the top surface of second insulation film 134. Then, the third insulation pattern 136' and the fourth etched insulation film 138" are formed on the blue and green regions B and G, covering the second insulation film 134 in sequence but not over the blue regions B. The exemplary embodiment shown in FIG. 6 is different from that shown in FIG. 3 in that the second insulation 134 is not etched.

In the former embodiment, second insulation film 134 was etched during the processing step of patterning the fourth insulation film 138' to form the etched fourth insulation film 138". As a result, and as described in relation to FIG. 4, the second insulation pattern 134' is formed on the blue regions B, thereby exposing the top surface of first insulation film 132.

Within the exemplary image sensor illustrated in FIG. 5, reflection protection structure 131 may be variously constructed in accordance with different kinds of color filters (e.g., 161, 162, and 163).

Returning to FIG. 5, field isolation regions 110 are settled in predetermined field of semiconductor substrate 100, confinng the plural pixel regions 105 that constitute a pixel array. The color filters are arranged on the pixel regions 105.

According to one embodiment by the invention, the color filters are composed of red filters 161, blue filters 162, and green filters 163, transmitting light with wavelengths of red, blue, and green, respectively. However, the color filters may be composed of four kinds transmitting cyan, magenta, yellow, and green, respectively.

Pixel regions 105 may be differentiated by colors of light transmitted through different color filters. For instance, if the color filters are arranged to transmit the light of red, green, and blue, the pixel regions 105 may be divisionally disposed in correspondence respectively with red, green, and blue under the color filters.

Photoelectric conversion regions 120 are formed in the pixel regions 105, transforming the incident light into signal charges. Photoelectric conversion regions 120 may be photodiodes constituting PN junctions.

Microscopic lenses 170 are arranged on color filters 161, 162, and 163, thereby improving (e.g., condensing) the characteristics of the incident light. Reflection protection structure 131 is disposed between the color filters and semiconductor substrate 100. Interlevel insulation film 140 and metal interconnections 150 are disposed between reflection protection structure 131 and color filters 161, 162, and 163.

According to one embodiment of the invention, reflection protection structure 131 may be constructed in various configurations (e.g., with various portions of different thickness) with respect to the different kinds of color filters (e.g., 161, 162, and 163) located thereon.

Thus, the variable thicknesses of portions of reflection protection structure 131 correspond with expected pixel color and the associated color filter, such that variation in photoelectric conversion efficiency is minmized across the range of incident light wavelengths. Namely, as the red colored incident light has a longer wavelength and penetrates to a greater depth than blue colored incident light, the varying thicknesses of the reflection protection structures mitigate any adverse such a difference may cause in the image sensor.

The foregoing teachings are applicable to an image sensor employing another configuration of color model such as RGB, CMY, CMYK, CIE color space, YIQ, YUV, YCrCb, or HSV/HSB. In this case, the corresponding reflection protection structure has an understructure differentiated by the number of filters corresponding to each of the color models. And, the thickness of the understructure is higher as the wavelength of light transmitting its corresponding optical filters.

According to the invention, the thickness and architecture of the reflection protection structure are variable in correspondence with colors of light transmitting the color filters. In detail, the reflection protection structure becomes thicker as the wavelength of light transmitting its corresponding optical filters arranged thereon. Thus, it is possible to restrain the phenomenon of decreasing the efficiency of photoelectric conversion for a long-wavelength color rather than a short-wavelength color. In addition, electron-hole pairs generated by the long-wavelength light flow into adjacent pixel regions, reducing the problem of crosstalk therein.

While the present invention has been described in connection with several embodiments of the invention illustrated in the accompanying drawings, it is not limited thereto. It will be apparent to those skilled in the art that various substitutions, modifications and changes may be thereto without departing from the scope of the invention as defined by the following claims.

What is claimed is:

1. A method of fabricating an image sensor, comprising:
   forming a plurality of photoelectric conversion regions in predetermined fields of a semiconductor substrate, wherein the plurality of photoelectric conversion regions comprises first, second, and third color regions;
   forming a reflection protection structure on the plurality of photoelectric conversion regions by sequentially forming first, second, third, and fourth insulation films on the plurality of photoelectric conversion regions, sequentially etching the fourth, third, and second insulation films in the first color region to expose the first insulation film in the first color region, and etching the fourth insulation film in the second color region to expose the third insulation film in the second color region; and
   forming a plurality of color filters, including at least first, second, and third color filters on the reflection protection structure,
   wherein the reflection protection structure comprises at least first, second, and third portions respectively associated with one of the first, second, and third color regions.

2. The method of claim 1, wherein forming the plurality of-color filters comprises:
   forming the first color filter associated with incident light having a longer wavelength and forming the second color filter associated with incident light having a shorter wavelength;
   wherein the first portion of the reflection protection structure has a first thickness, the second portion has a second thickness greater than the first thickness, and the third portion has a third thickness greater than or equal to the second thickness.

3. The method of claim 1, wherein forming the first, second, and third color filters comprises:
   forming the first, second, and third color filters adapted to transmit incident light of blue, green and red colors, respectively.

4. The method of 1, wherein the fourth insulation film has etch selectivity relative to the third insulation film, the third insulation film has etch selectivity relative to the second insulation film, and the second insulation film has etch selectivity relative to the first insulation film.

5. The method of claim 4, wherein the first and third insulation films are formed from silicon oxide films, and
   wherein the second and fourth insulation films are formed from silicon nitride films.

6. The method of claim 1, wherein forming the plurality of color filters comprises:
   forming color filters adapted to transmit light of different wavelengths for color models with RGB, CMY, CMYK, CIE color space, YIQ, YUV, YCrCb, and HSV/HSB.

7. A method of fabricating an image sensor, comprising:
   forming a plurality of photoelectric conversion regions in a semiconductor substrate, wherein the plurality of photoelectric conversion regions comprises first, second, and third color regions;
   sequentially forming a plurality of insulation films on the plurality of photoelectric conversion regions, and sequentially and selectively etching the plurality of insulation films to form a reflection protection structure on the plurality of photoelectric conversion regions, wherein the reflection protection structure comprises a plurality of portions including at least a first portion having a first thickness and a second portion having a second thickness different from the first thickness, wherein the first and second portions are formed over respective ones of the first, second, and third color regions; and forming a plurality of color filters, including at least first, second, and third color filters, on the reflection protection structure, wherein the first, second, and third color filters are respectively aligned with the first, second, and third color regions, wherein sequentially forming the plurality of insulation films on the plurality of photoelectric conversion regions, and sequentially and selectively etching the plurality of insulation films to form a reflection protection structure comprises:

sequentially forming the first, second, third, and fourth insulation films on the plurality of photoelectric conversion regions;

etching at least the fourth and third insulation films over the third color region to expose either an upper surface of the first insulation film or an upper surface of the second insulation film; and etching the fourth insulation film over the second color region to expose an upper surface of the third insulation film.

8. The method of claim 7, wherein the first, second, and third color regions are respectively associated with the conversion of incident light in the blue, green, and red spectra; and the first, second, and third color filters are respectively associated with the transmission of incident light in the blue, green, and red spectra.

9. The method of claim 7, wherein plurality of photoelectric conversion elements further comprises a fourth color region and the plurality of color filters further comprises a fourth color filter, wherein the first, second, third and fourth color regions are respectively associated with the conversion of incident light in the cyan, magenta, yellow, and green spectra, and the first, second, third, and fourth color filters are respectively associated with the transmission of incident light in the cyan, magenta, yellow, and green spectra.

10. The method of claim 7, wherein the plurality of portions comprises the first and second portions and a third portion having a third thickness;

the first portion is formed on the first color region adapted to convert incident light in the blue spectrum, the second portion is formed on the second color region adapted to convert incident light in the green spectrum, and the third portion is formed on the third color region adapted to convert incident light in the red-spectrum, and wherein the first thickness is less than the second and third thicknesses.

11. The method of claim 10, wherein the third thickness is greater than the second thickness.

12. The method of claim 7, further comprising:

forming an interlevel insulation film comprising metal interconnections between the reflection protection structure and the plurality of color filters.

13. The method of claim 7, further comprising: forming microscopic lenses on the plurality of color filters.

* * * * *